United States Patent [19]
Laurens

[11] Patent Number: 6,071,786
[45] Date of Patent: Jun. 6, 2000

[54] METHOD OF MANUFACTURING A BIPOLAR TRANSISTOR AND ITS EMITTER CONTACT

[75] Inventor: Michel Laurens, Saint Egreve, France

[73] Assignee: STMicroelectronics, S.A., Gentilly, France

[21] Appl. No.: 09/060,512

[22] Filed: Apr. 14, 1998

[30] Foreign Application Priority Data

Apr. 15, 1997 [FR] France .................................. 97 04913

[51] Int. Cl.[7] ................................................ H01L 21/331
[52] U.S. Cl. ........................... 438/364; 438/369; 438/942
[58] Field of Search .................................... 438/309, 364, 438/369, 942, 200, 209, 203

[56] References Cited

U.S. PATENT DOCUMENTS 5,501,991   3/1996   Jang .......................................... 437/31
5,851,863  12/1998   Fujii et al. ............................... 438/203

FOREIGN PATENT DOCUMENTS 0 244 171  11/1987   European Pat. Off. ........ H01L 29/72

OTHER PUBLICATIONS

Wolf, S., Tauber R.N.; Silicon Processing for the VLSI Era vol. 1: Process Technology, Lattice Press, Sunset Beach, CA, p.p. 321–323, Jan. 1986.

*Primary Examiner*—John F. Niebling
*Assistant Examiner*—Christopher Lattin
*Attorney, Agent, or Firm*—Theodore E. Galanthay; David V. Carlson; Seed IP Law Group, PLLC

[57] ABSTRACT

A method of manufacturing a bipolar transistor in an integrated circuit including the steps of forming a P-type base area, coating this base area with an isolating layer, and forming an opening in the isolating layer at a location where it is desired to form the emitter region. The method further includes coating the structure with an N-type doped polysilicon layer, etching the polysilicon layer to delimit a portion therefrom, forming spacers at a periphery of the polysilicon portion, and implanting a P-type dopant to form a base contact making region, after masking the polysilicon portion, above the area where it is in contact with the base area.

9 Claims, 1 Drawing Sheet

METHOD OF MANUFACTURING A BIPOLAR TRANSISTOR AND ITS EMITTER CONTACT

TECHNICAL FIELD

The present invention relates to the manufacturing of integrated circuits, and more particularly of bipolar transistors. The present invention more specifically applies to the implementation of bipolar transistors in integrated circuits in mixed bipolar/MOS (BICMOS) technology, the elementary dimensions of which are submicronic, that is, where the smallest dimension can be on the order of 0.2 to 0.5 µm.

BACKGROUND OF THE INVENTION

FIGS. 1 and 2 show steps of manufacturing an NPN bipolar transistor, and more specifically of its emitter contact.

Given an upper region of an epitaxial layer 1 delimited by a thick oxide area 2, a P-type base region 3 has been formed in the surface of the N-type epitaxial layer 1. It will be understood that the epitaxial layer 1 under the base region 3 is a collector region. The structure is coated with an insulating or isolating layer 5 in which an opening 6 is formed, and the whole is coated with a heavily-doped polysilicon layer 8 of type N+. This is shown in FIG. 1.

In a subsequent step, illustrated in FIG. 2, the polysilicon layer 8 is etched to leave in place a polysilicon pad 10. This pad 10 must be wide enough to be sure that it is not narrower than the opening 6 and to enable to subsequently take a contact on its upper surface by means of a via etched in an insulating layer. After this, lateral spacers 12 are formed at the periphery of the polysilicon pad 10. An emitter diffusion or layer 13 is then formed by fast thermal anneal in the base region 3 from the polysilicon pad 10. The emitter layer 13 forms an NPN bipolar transistor with the base region 3 and the collector region or epitaxial layer 1.

FIG. 3 shows a structure having the same functional characteristics as those of FIG. 2, except that the emitter area has been shown substantially at the center of the base area 3 and thus has a substantially symmetrical outlook. In FIG. 3, the same elements are referred to by same references as in FIG. 2.

In a practical implementation, the opening 6 in the insulating layer 5 has for example a width on the order of 0.5 µm and the insulating layer 5 has for example a width on the order of 80 nm to 120 nm.

To be sure that the polysilicon pad 10 extends beyond the opening 6, it is normally etched from a mask, the lateral dimensions of which are 0.3 µm larger on each side than the dimensions of the opening 6. Thus, this pad 10 has a width of substantially 1.1 µm. It can have the same length or be of triangular shape.

At a further step of the method, it is desired to form a region of higher level of doping 14 for the base contact recovery. This is performed with an implantation 16, for example, a boron implantation. A resist layer 18 has been shown outside the emitter-base area. This resist layer is meant to mask other areas of the integrated circuit formed in the same silicon wafer.

In the manufacturing steps previously described, it has been assumed that, since the polysilicon pad 10 is very heavily N-type doped by an arsenic implantation, the boron implantation 16 is not likely to reverse its type of polarity and disturb the implementation of the N+-type heavily-doped emitter diffusion.

However, the applicant has observed defects on this type of component which did not meet the expected specifications, especially as concerns their gain.

SUMMARY OF THE INVENTION

According to principles of the present invention, a method of manufacturing of a bipolar transistor in an integrated circuit is provided including the steps of forming a base area of a first type of conductivity, coating this base area with an isolating layer, forming an opening in the isolating layer at a location where it is desired to form the emitter region, and coating the structure with a polysilicon layer doped according to a second type of conductivity. The polysilicon layer is etched to delimit a portion therefrom according to a chosen contour, and spacers are formed at the periphery of the polysilicon portion. A dopant of the first type of conductivity is implanted to form a base contact making region. The implantation is performed after forming a mask partially covering the polysilicon pad, at least above the area where it is in contact with the base area.

The polysilicon may be arsenic doped and the base contact region may be boron doped. The isolating layer and the spacers may be in silicon oxide. The isolating layer and the spacers may also be in silicon nitride.

The foregoing characteristics and advantages of the present invention will be discussed in detail in the following non-limiting description of specific embodiments, in connection with the accompanying drawings.

DETAILED DESCRIPTION OF THE INVENTION

Figure 3:
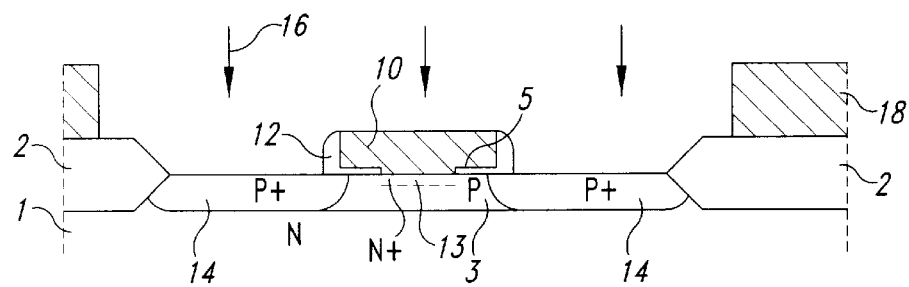
Figure 4:
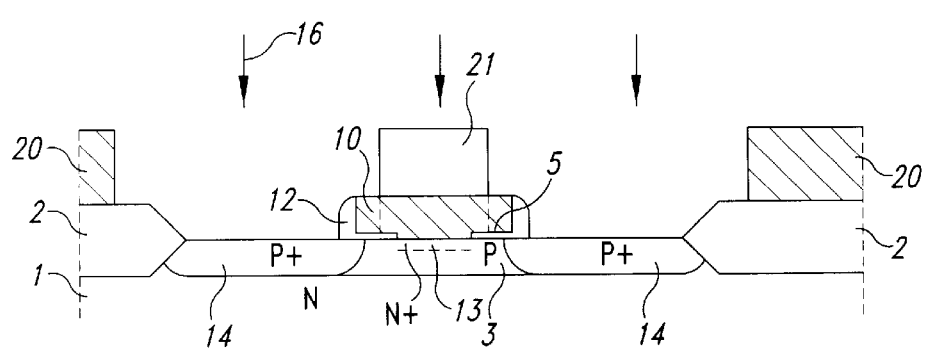
FIG. 4 illustrates a method of manufacturing an NPN transistor according to an embodiment of the present invention.

FIG. 4 designates an embodiment of the present invention including similar elements as those of FIG. 3 with the same references. One difference is that the mask resist layer 18 is replaced with a mask resist layer 20 which includes a portion formed on the upper surface of the polysilicon pad 10.

Figure 1:
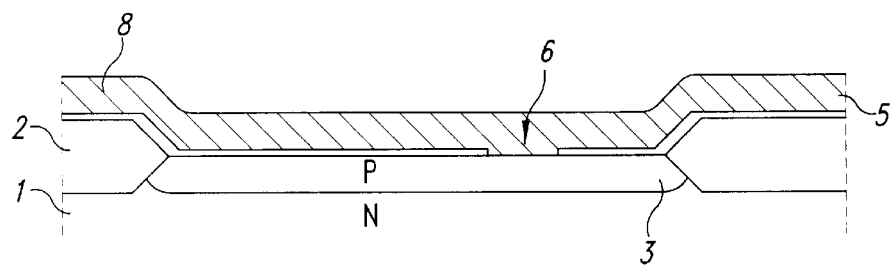
FIGS. 1 to 3, previously described, illustrate steps of a method of manufacturing of an NPN transistor according to the prior art.
Figure 2:
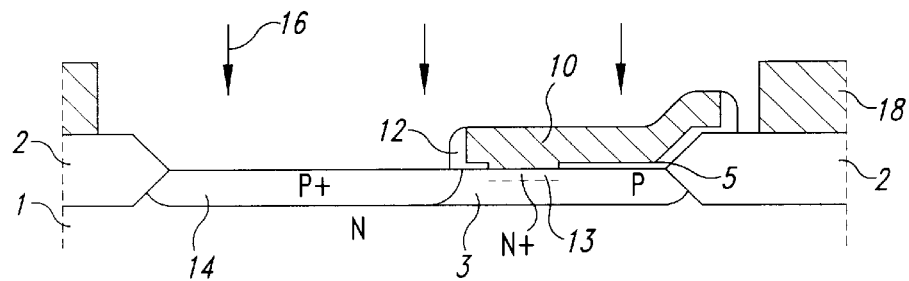

Indeed, as previously indicated, the NPN transistor illustrated in FIGS. 2 and 3 actually shows a lower gain than expected.

Experiments performed by the applicant have shown that this lower gain essentially results from the boron implantation 16 which modifies the doping of the emitter layer 13 and which can even create a ghost inversion layer. To overcome this disadvantage, the applicant has first tried to form a mask layer self-aligned on pad 10, and has attempted to keep the resist layer which served to the definition of pad 10. However, this has appeared to be incompatible with the etching steps of isolating layer 5, be it a silicon oxide layer or a silicon nitride layer.

Thus, for a start, the applicant has attempted to optimize boron implantation 16 to avoid the above-mentioned disadvantage, given that the very small dimension of pad 10 seemed to make impossible a substantially conformal deposition of this pad. But this leads to doping defects of the simultaneously doped MOS transistors gates.

Then, and according to the illustrated embodiment of the present invention, the applicant has noted that it is not necessary to completely mask the polysilicon pad 10 but that it is enough to mask its central portion, as is shown in FIG. 4. Indeed, even if a P-type implantation occurs on the edges of the polysilicon pad 10, in the area above the isolating layer 5, this is without disadvantages for the transistor since this area of the polysilicon pad 10 does not participate in the doping of the emitter and cannot sufficiently extend to disturb the useful area. Thus, the illustrated embodiment of the present invention provides to place a resin pad 21, the dimensions of which are lower by 0.1 to 0.2 μm than those of the polysilicon pad 10, which is compatible with the line used in which the alignment accuracy of the masks is on the order of 0.15 μm.

Of course, the present invention is likely to have various alterations, modifications, and improvements which will readily occur to those skilled in the art. For example, the isolating layer 5 can be a silicon nitride layer or a silicon oxide layer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method of fabricating a bipolar junction transistor comprising:

forming a collector region of a first conductivity type;

forming a base region of a second conductivity type in a surface of the collector region;

coating the base region with an isolating layer;

forming an opening in the isolating layer;

forming an emitter pad over the isolating layer and the opening;

forming an emitter diffusion in the base region below the opening;

forming a mask over the emitter pad by forming a resin pad over the emitter pad that is narrower than the emitter pad;

implanting supplemental dopant of the second conductivity type in the bipolar junction transistor to form a base contact recovery region in the base region that does not include the base region under the opening, the base contact recovery region having a higher dopant concentration than the base region under the opening.

2. The method of claim 1 wherein the step of forming a collector region comprises forming an N-type epitaxial layer.

3. The method of claim 1 wherein the step of forming an emitter pad comprises:

coating the isolating layer and the opening with an N-type polysilicon layer;

etching the polysilicon layer to form a polysilicon pad over the opening having an area greater than an area of the opening; and forming lateral spacers in contact with edges of the polysilicon pad.

4. The method of claim 1 wherein the step of forming an emitter diffusion comprises forming an emitter diffusion in the base region below the opening and in contact with the emitter pad with a fast thermal anneal.

5. The method of claim 1 wherein the step of implanting supplemental dopant comprises implanting boron.

6. A method of manufacturing a bipolar transistor in an integrated circuit, including the steps of:

forming a base area of a first type of conductivity;

coating the base area with an isolating layer;

forming an opening in the isolating layer at a location where it is desired to form an emitter region;

coating the isolating layer and the opening with a polysilicon layer doped according to a second type of conductivity;

etching the polysilicon layer to delimit a polysilicon portion therefrom;

forming spacers at a periphery of the polysilicon portion;

forming a mask partially covering the polysilicon portion above an area where the polysilicon portion is in contact with the base area; and implanting a dopant of the first type of conductivity to form a base contact region.

7. The method of claim 6 wherein the polysilicon portion is arsenic doped and the base contact region is boron doped.

8. The method of claim 6 wherein the isolating layer and the spacers are formed in silicon oxide.

9. The method of claim 6 wherein the isolating layer and the spacers are formed in silicon nitride.

* * * * *